US009667259B2

(12) United States Patent
Goumballa et al.

(10) Patent No.: US 9,667,259 B2
(45) Date of Patent: May 30, 2017

(54) APPARATUS AND METHOD FOR GENERATING A TEMPERATURE-DEPENDENT CONTROL SIGNAL

(71) Applicant: FREESCALE SEMICONDUCTOR, INC., Austin, TX (US)

(72) Inventors: Birama Goumballa, Balma (FR); Cristian Pavao-Moreira, Frouzins (FR); Yi Yin, Munich (DE)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/037,500

(22) PCT Filed: Nov. 22, 2013

(86) PCT No.: PCT/IB2013/002897
§ 371 (c)(1),
(2) Date: May 18, 2016

(87) PCT Pub. No.: WO2015/075496
PCT Pub. Date: May 28, 2015

(65) Prior Publication Data
US 2016/0308537 A1    Oct. 20, 2016

(51) Int. Cl.
H03L 1/00    (2006.01)
H03L 1/02    (2006.01)
(Continued)

(52) U.S. Cl.
CPC ............... H03L 1/023 (2013.01); G01K 1/02 (2013.01); G01K 7/01 (2013.01); G01K 7/16 (2013.01);
(Continued)

(58) Field of Classification Search
CPC .. G05F 3/30; G05F 1/561; G01K 7/01; G01K 7/16; H03K 3/0377; H03K 5/24; H03L 1/023; H03L 1/026
(Continued)

(56) References Cited

U.S. PATENT DOCUMENTS 5,608,347 A    3/1997 Kearney
6,111,396 A    8/2000 Lin et al.
(Continued)

FOREIGN PATENT DOCUMENTS

JP    10197625 A    7/1998
KR    20030069514 A    8/2003

OTHER PUBLICATIONS

International Search Report for application PCT/IB2013/002897 (Aug. 21, 2014).

Primary Examiner — Arnold Kinkead
(74) Attorney, Agent, or Firm — Charlene R. Jacobsen

(57) ABSTRACT

A current-to-voltage converter receives a current which varies with temperature according to a selected one of two or more temperature coefficient factors and converts it to a temperature-dependent voltage to be used as a control signal to a varactor in a voltage controlled oscillator, VCO, to compensate for temperature-induced frequency drift in the VCO. A feedback arrangement with hysteresis is provided for controlling the selection of the temperature coefficient factor and operates by comparing the temperature-dependent voltage with a reference voltage. The reference voltage may be pre-set and equivalent to a known operating temperature. A switching signal is generated when Vout approaches the reference voltage and in response, a control module generates a selection signal for selecting a different temperature coefficient factor. Thus, multi-slope voltage and current generation with a wide dynamic range is continu-
(Continued)

ously provided, which is particularly useful for controlling VCO's used in short range FMCW radar systems.

11 Claims, 6 Drawing Sheets

(51) Int. Cl.
| | |
|---|---|
| *G01K 7/01* | (2006.01) |
| *G05F 3/30* | (2006.01) |
| *G01K 7/16* | (2006.01) |
| *G01K 1/02* | (2006.01) |
| *H03K 3/011* | (2006.01) |
| *G05F 1/56* | (2006.01) |
| *H03K 3/037* | (2006.01) |
| *H03K 5/24* | (2006.01) |

(52) U.S. Cl.
CPC ............ *G05F 1/561* (2013.01); *G05F 3/30* (2013.01); *H03K 3/011* (2013.01); *H03K 3/0377* (2013.01); *H03K 5/24* (2013.01); *H03L 1/022* (2013.01)

(58) Field of Classification Search
USPC .......... 331/176; 374/163, 178; 702/130; 323/907, 313, 314, 312
See application file for complete search history.

(56) References Cited

U.S. PATENT DOCUMENTS

| | | | |
|---|---|---|---|
| 6,566,849 | B1 | 5/2003 | Chavan et al. |
| 6,873,143 | B2 | 3/2005 | Moon et al. |
| 7,164,325 | B2 | 1/2007 | Aparin et al. |
| 8,253,506 | B2 | 8/2012 | Liu et al. |
| 8,466,750 | B2 | 6/2013 | Chiu et al. |
| 2002/0109539 | A1 | 8/2002 | Takeuchi et al. |
| 2005/0128017 | A1 | 6/2005 | Meltzer |
| 2005/0248330 | A1 | 11/2005 | Lin et al. |
| 2016/0138978 | A1* | 5/2016 | Eberlein .......... G01K 7/01 374/170 |

* cited by examiner

APPARATUS AND METHOD FOR GENERATING A TEMPERATURE-DEPENDENT CONTROL SIGNAL

FIELD OF THE INVENTION

This invention relates to an apparatus and a method for generating a temperature-dependent control signal and has particular application to the generation of a multi-slope voltage signal which varies with temperature and which may be used as a control signal for a voltage controlled oscillator (VCO) in order to compensate for temperature induced offsets in the VCO's output.

BACKGROUND OF THE INVENTION

Voltage Controlled Oscillators (VCO) find application in a variety of devices and systems such as cellular phones and automotive radar systems. VCO's can be configured to tune across a fairly wide frequency range using a relatively narrow control voltage range. However, the output of a typical VCO can vary with temperature. The frequency response of a VCO can be temperature compensated by applying a temperature variable voltage source to varactors that form part of a VCO resonant circuit. U.S. Pat. No. 7,164,325 discloses a temperature stabilised VCO where a reference end of the varactor can be supplied with a temperature dependent voltage source that has a temperature dependence that substantially compensates for varactor temperature dependence. A temperature-dependent voltage source can be configured, for example, as a Proportional-To-Absolute-Temperature module which can include a constant current source configured to drive a selectable resistive load which can include an array of selectable resistors. Such a linear temperature compensation scheme is generally adequate for long range automotive radar applications operating in the 76-77 GHz frequency band. However, more stringent requirements need to be met for short range systems (77-81 GHz). Non-linear temperature compensation systems are known. For example, U.S. Pat. No. 5,608,347 discloses a temperature-dependent signal compensation circuit for generating a dual sloped compensation signal responsive to changes in operating temperature of the compensation circuit. The compensated signal is used to vary the gain of an amplifier in this system. A switch selectively couples either a first slope calibration signal or a second slope calibration signal to an output voltage of a voltage generator circuit in response to the changes in operating temperature. For an automotive radar application where FMCW, (frequency modulated continuous wave) signals are employed, it is preferable for a non-linear compensation signal to be free of any discontinuities.

SUMMARY OF THE INVENTION

The present invention provides an apparatus and method for generating a temperature-dependent control signal as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Figure 1:
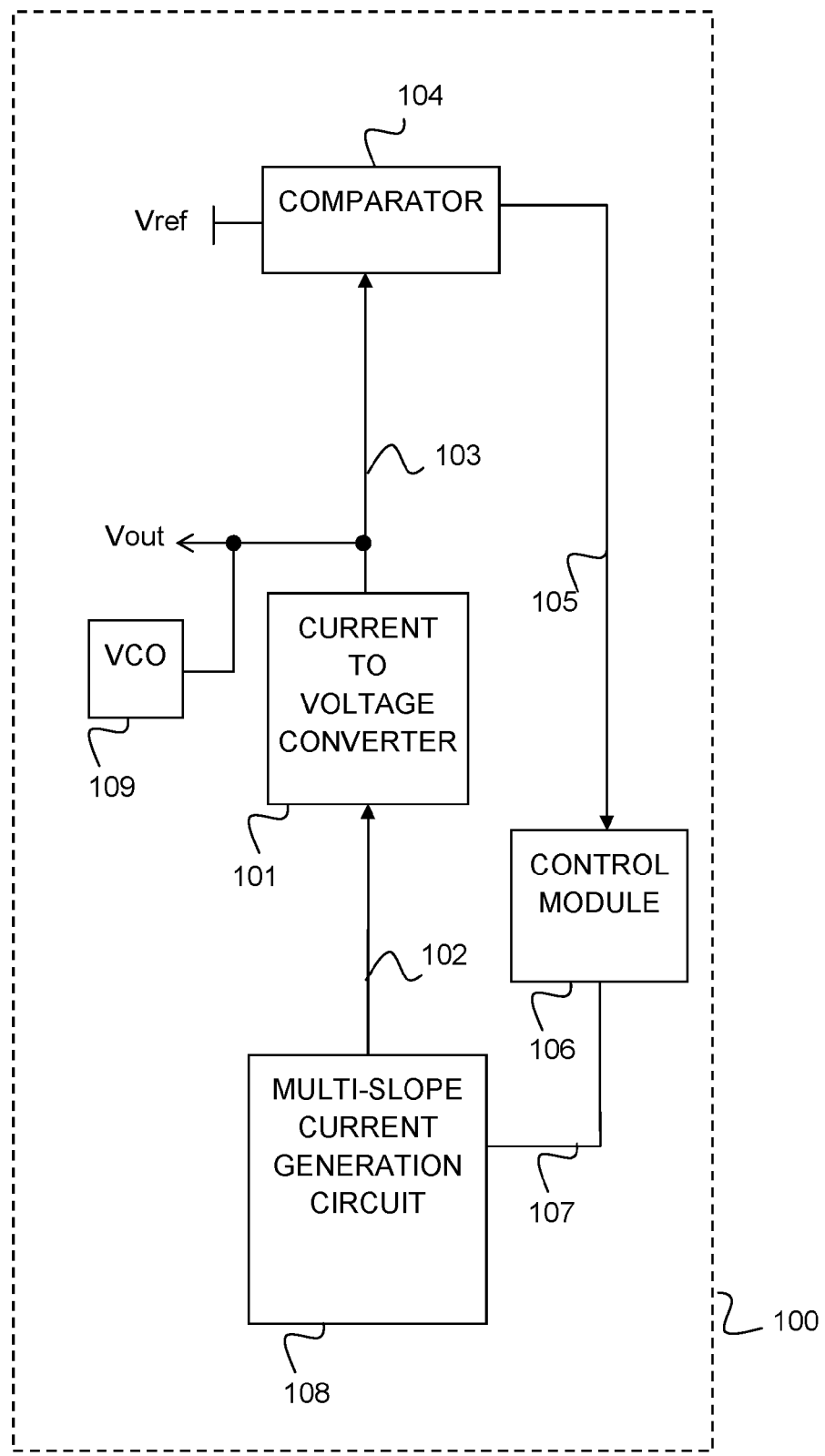
FIG. 1 is a simplified block diagram of a first example of apparatus for generating a temperature-dependent control signal.

Referring now to FIG. 1, an apparatus 100 for generating a temperature-dependent control signal may comprise a current-to-voltage converter 101 which may be arranged to receive a current on line 102 which varies with temperature according to a selected one of two or more temperature coefficient factors. The current-to-voltage converter 101 may be further arranged to convert the received temperature-dependent current to a temperature-dependent voltage Vout on an output line 103. A comparator 104 may be operably coupled to the current-to-voltage converter 101 and arranged to receive the temperature-dependent voltage Vout. The comparator 104 may be further arranged to compare the received temperature-dependent voltage Vout with a reference voltage Vref. The reference voltage may be preset and provided by an external source (not shown). The comparator 104 may be further arranged to generate a switching signal on an output line 105 when the received temperature-dependent voltage Vout reaches a pre-set value relative to the reference voltage Vout. A control module 106 may be operably coupled to the comparator 104 and arranged to generate a selection signal on an output line 107 when a switching signal is received from the comparator 104. The control module 106 may be a logic module comprising simple digital circuitry and in some embodiments may include a look up table functionality. The selection signal may be used for selecting a different one of the aforementioned two or more temperature coefficient factors. In this way, a multi-slope temperature dependent voltage may be generated at the output 103 of the current-to-voltage converter for application to a varactor diode of a VCO 109 for example, in order to compensate for temperature-induced offsets. In one embodiment, the VCO 109 may be external to the apparatus 100. In another embodiment, the VCO 109 and the apparatus 100 may be included in the same device or integrated circuit, for example.

In one embodiment the apparatus 100 may comprise a multi-slope current generation circuit 108 arranged to generate a temperature-dependent current which varies with temperature according to a selected one of two or more temperature coefficient factors. This circuit 108 may have an output operably coupled to the current-to-voltage converter 101 and an input operably coupled to the control module 106. In one embodiment, the current generation circuit 108 may be arranged to select a different one of two or more temperature coefficient factors in response to a selection signal received from the control module 106, hence generating multi-slope temperature-dependent currents.

In one example embodiment, the multi-slope current generation circuit 108 may comprise a temperature coefficient factor circuit of the type described in Applicant's co-pending application Ser. No. 14/441,246. One example of such a multi-slope current generation circuit will now be described with reference to FIGS. 2 and 3.

Figure 2:
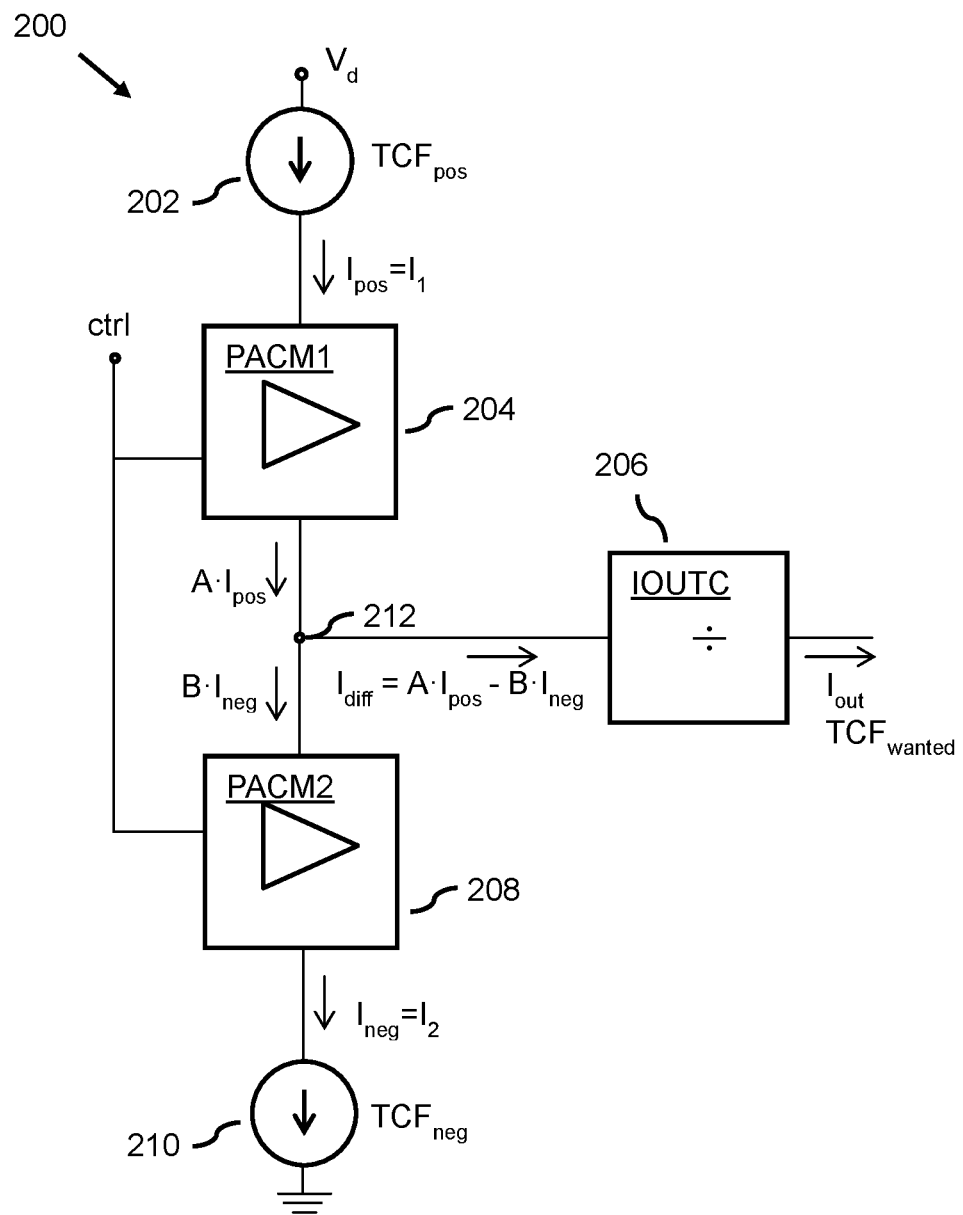
FIG. 2 is a simplified block diagram of a first example of a temperature coefficient factor (TCF) circuit.

In FIG. 2 a temperature coefficient factor (TCF) circuit 200 may comprise a first current source 202, a second current source 210, a common node 212, a first programmable amplifying current mirror PACM1, 204, a second programmable amplifying current mirror PACM2, 208 and a current output circuit IOUTC, 206.

The first current source 202 may provide, in operation, a first current $I_{pos}$ which varies with the temperature according to a first temperature coefficient factor $TCF_{pos}$ which has a positive value. The second current source 210 may provide, in operation, a second current $I_{neg}$ which varies with the temperature according to a second temperature coefficient factor $TCF_{neg}$ which has a negative value.

The first programmable amplifying current mirror PACM1 may receive the first current $I_{pos}$, receives a control signal ctrL and is coupled to the common terminal 212. The first programmable amplifying current mirror PACM1 may conduct a first amplified current $A \cdot I_{pos}$ to the common terminal 212. The received first current may be amplified towards the first amplified current $A \cdot I_{pos}$ according to a first amplification factor A. The first amplification factor A may be adapted in dependence of the control signal ctrl.

The second programmable amplifying current mirror PACM2 may receive the second current $I_{neg}$, receives the control signal ctrl and is coupled to the common terminal 212. The second programmable amplifying current mirror PACM2 may conduct a second amplified current $B \cdot I_{neg}$ away from the common terminal 212. The received second current $I_{neg}$ may be amplified towards the second amplified current $B \cdot I_{neg}$ according to a second amplification factor B. The second amplification factor B may be adapted in dependence of the control signal ctrl. The control signal ctrl may be provided by the control module 106 of FIG. 1.

The output current circuit IOUTC, 206 may be coupled to the common terminal 212 and may conduct a difference current $I_{diff}$ away from the common terminal 212. The difference current $I_{diff}$ may be substantially equal to the first amplified current $A \cdot I_{pos}$ minus the second amplified current $B \cdot I_{neg}$. The output current circuit IOUTC, 206 may provide, in operation, an output current $I_{out}$ which varies with a required temperature coefficient factor $TCF_{wanted}$. The output current $I_{out}$ may be based on the difference current. In one embodiment, the output current $I_{out}$ may be fed to an input of the current-to-voltage converter 101 of FIG. 1 for conversion to a temperature dependent voltage.

The operation of the circuit is explained on basis of a mathematical deduction:

It is known that:

$$TCF = \frac{\partial I}{\partial T} \cdot \frac{1}{I} \tag{1}$$

$$I_{diff} = A \cdot I_{pos} - B \cdot I_{neg} \tag{2}$$

The derivative of (2) with respect to T is:

$$\frac{\partial I_{diff}}{\partial T} = A \cdot \frac{\partial I_{pos}}{\partial T} - B \cdot \frac{\partial I_{neg}}{\partial T} \tag{3}$$

When (1) and (3) are combined, and when it is assumed that $I_{out}=I_{diff}$, one gets:

$$I_{diff} \cdot TCF_{wanted} = A \cdot I_{pos} \cdot TCF_{pos} - B \cdot I_{neg} \cdot TCF_{neg} \tag{4}$$

If one assumes that $I_{pos}=I_{neg}=I$, and $I_{diff}$ is replaced by (2) in formula (4), and the result is rewritten to, one gets:

$$TCF_{wanted} = \frac{A \cdot TCF_{pos} - B \cdot TCF_{neg}}{A - B} \tag{5}$$

Thus, formula (5) shows that the TCF of the output current is a combination of the TCF of the first current source and the TCF of the second current source and that the TCF of the output current depends on the TCF of the first current source and of the second current source by the amplification factors A and B.

If it is assumed that $$R = \frac{A}{B}$$

and formula (5) is rearranged, one gels:

$$R = \frac{TCF_{wanted} - TCF_{neg}}{TCF_{wanted} - TCF_{pos}} \tag{6}$$

Thus, with formula (6) R can be calculated and subsequently the amplification factors A and B may be chosen such that the ratio of the chosen amplification factor A and B are close the ratio R which is calculated with formula (6).

In a practical embodiment, the control signal comprises information about the wanted TCF $TCF_{wanted}$, the TCF of the first current course $TCF_{pos}$, and the TCF of the second current source $TCF_{neg}$. Subsequently, a controller of the first programmable amplifying current mirror PACM1 may calculate a value R, select values A and B, and use the value A as its amplification factor. A controller of the second programmable amplifying current mirror PACM2 may calculate a value R, select values A and B, and use the value B as its amplification factor. The second programmable amplifying current mirror PACM2 may select the values A and B in the same manner as the first programmable amplifying current mirror PACM1. The selected values A and B results in a value $$R_{selected} = \frac{A_{selected}}{B_{selected}}$$

which is approximately the value R of formula (6). In an embodiment, the value $R_{selected}$ may not deviate more than 10% from the calculated value R of formula (6). In an embodiment, the value $R_{selected}$ may not deviate more than 5% from the calculated value R of formula (6). In another embodiment, the first programmable amplifying current mirror PACM1 and the second programmable amplifying current mirror PACM2 may have the capability to only use an amplification factor from a predefined set of amplification factors $A_1 \ldots A_n$, $B_1 \ldots B_m$ and from this predefined set of amplification a combination of one $A_x$ amplification factor and one $B_y$ amplification factor may be selected such that the $$R = \frac{A_x}{B_y}$$

is closest to me ratio calculated by formula (6) and such that other factors based on other selections are less close to the ratio R calculated by formula (6).

It is to be noted that it is assumed in the previous paragraph that the TCF of the first current source and of the second current source have a fixed value. However, in some embodiments the TCF of the first current source and of the second current source may be changed to a required value.

In an example, assume that the TCF of the first current source is $TCF_{pos}$=3504 ppm/K and the TCF of the second current source is $TCF_{neg}$=−1450 ppm/K. These values may be the result of a specifically designed current source and may be measured after manufacturing the respective current source. If, for example, the required TCF of the output current $TCF_{wanted}$=4500 ppm/K, than the ratio R, calculated with formula (6) is R=5.97. If the first amplification factor is chosen to be A=6 and if the second amplification factor is chosen to be B=1, than, the selected ratio $R_{selected}$=6, which is relatively close to the calculated value. Thus, the first programmable amplifying current mirror PACM1 amplifies current $I_{pos}$ with a factor 6, and the second programmable amplifying current mirror PACM2 amplifies current $I_{neg}$ with a factor 1.

In summary, FIG. 2 shows an example of a temperature coefficient factor circuit 200 which generates a current $I_{out}$ which varies with temperature according to a programmable temperature coefficient factor $TCF_{wanted}$. The temperature coefficient factor circuit 200 comprises a first current source 202 providing a first current with a positive temperature coefficient factor $TCF_{pos}$, a second current source 210 providing a second current with a negative temperature coefficient factor $TCF_{neg}$, a common terminal 212, a first programmable amplifying current mirror PACM1, a second programmable amplifying current mirror PACM2 and a current output circuit IOUTC. The first programmable amplifying current mirror PACM1 provides in dependence of a control signal ctrl an amplified first current to the common terminal 212. The second programmable amplifying current mirror PACM2 conducts away in dependence of the control signal ctrl an amplified second current from the common terminal 212. The current output circuit IOUTC provides the output current $I_{out}$ based on a difference current between the amplified first current and the amplified second current.

Figure 3:
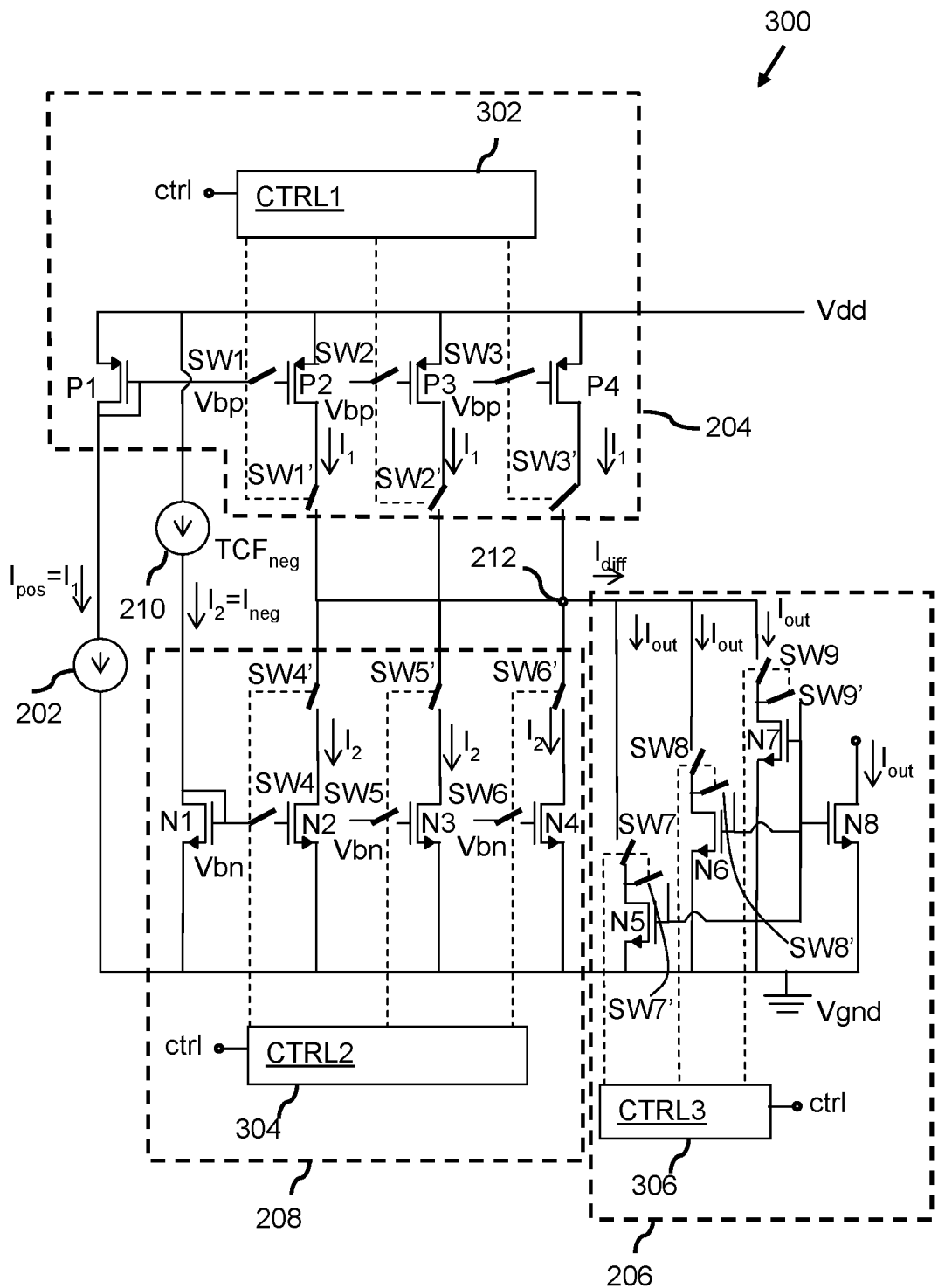
FIG. 3 is simplified circuit diagram of a second example of a temperature coefficient factor circuit.

FIG. 3 schematically shows in more detail an example of a temperature coefficient factor circuit 300. The temperature coefficient factor circuit may comprise a first current source 202, a second current source 210, a first programmable amplifying current mirror 204, a second programmable amplifying current mirror 208, a common node 212 and a current output circuit 206. The first current source 202 and the second current source 210 may have characteristics which have already been discussed in the context of FIG. 2.

The first programmable amplifying current mirror 204 comprises a first controller CTRL1, 302, a first MOS transistor P1 and a plurality of parallel arranged first mirror MOS transistor P2 . . . P4. The first MOS transistor P1 and the plurality of parallel arranged first mirror MOS transistor P2 . . . P4 are all of P-type, and that they have similar characteristics (such as gate width and length). The first MOS transistor P1 is arranged with its source-drain current conduction path in the current path of the current delivered by the first current source 202. A drain of the first MOS transistor P1 is coupled to a gate of the first MOS transistor P1. Each one of the plurality of parallel arranged first mirror MOS transistor P2 . . . P4 may be coupled with its gate, via a controllable switch SW1 . . . SW3 to the gate of the first MOS transistor P1. If such a first mirror MOS transistor is coupled to the gate of the first MOS transistor P1, it forms together with the first MOS transistor P1 a current mirror circuit and, if the first current $I_{pos}$=$I_1$ flows through the first MOS transistor P1, the same first current flows through the first mirror MOS transistor P2 . . . P4 which are coupled with its gate to the gate of the first MOS transistor P1. The first mirror MOS transistors P2 . . . P4 are coupled with a controllable switch SW1' . . . SW3' to the common node 212. Each one of the controllable switches SW1 . . . SW3 forms a pair with a corresponding controllable switch SW1' . . . SW3'. If one of the controllable switches SW1 . . . SW3 is closed, the corresponding controllable switch SW1' . . . SW3' is closed such that the mirrored first current provided by a specific one of the first mirror MOS transistor P2 . . . P4 is conducted towards the common node 212. If, for example, controllable switch pair SW1-SW1' and controllable switch pair SW2-SW2' are closed and controllable switch pair SW3-SW3' is not closed, two times the current $I_1$ is provided to the common node 212, and, thus, the amplification factor of the first programmable amplifying current mirror 104 is A=2. The first controller ctrl1 is configured to close or open the controllable switch pairs SW1-SW1' SW3-SW3' in dependence of the control signal ctrl. As discussed in the context of FIG. 2, the first controller may calculate a required value R and select an amplification factor A, and in line with the selected amplification factor A a corresponding number of controllable switch pairs SW1-SW1' SW3-SW3' is closed.

The second programmable amplifying current mirror 208 comprises a second controller CTRL2, 304, a second MOS transistor N1 and a plurality of parallel arranged second mirror MOS transistor N2 . . . N4. The second MOS transistor N1 and the plurality of parallel arranged second mirror MOS transistor N2 . . . N4 are all of an N-type, and that they have similar characteristics (such as gate width and length). The second MOS transistor N1 is arranged with its source-drain current conduction path in the current path of the current delivered by the second current source 210. A drain of the second MOS transistor N1 is coupled to a gate of the second MOS transistor N1. Each one of the plurality of parallel arranged second mirror MOS transistor N2 . . . N4 may be coupled with its gate, via a controllable switch SW4 . . . SW6 to the gate of the second MOS transistor N1.

If such a second mirror MOS transistor is coupled to the gate of the second MOS transistor N1, it forms together with the second MOS transistor N1 a current mirror circuit and, if the second current $I_{neg}=I_2$ flows through the second MOS transistor N1, the same second current $I_2$ flows through the second mirror MOS transistor N2 . . . N4 which are coupled with its gate to the gate of the second MOS transistor N1. The second mirror MOS transistors N2 . . . N4 are coupled with a controllable switch SW4' . . . SW6' to the common node 212. Each one of the controllable switches SW4 . . . SW6 forms a pair with a corresponding controllable switch SW4' . . . SW6'. If one of the controllable switches SW4 . . . SW6 is closed, the corresponding controllable switch SW4' . . . SW6' is closed such that the mirrored second current provided by a specific one of the second mirror MOS transistor N2 . . . N4 is conducted away from the common node 212. If, for example, controllable switch pair SW4-SW4' and controllable switch pair SW5-SW5' are closed and controllable switch pair SW6-SW6' is not closed, two times the current $I_2$ is conducted away from the common node 212, and, thus, the amplification factor of the second programmable amplifying current mirror 208 is B=2. The second controller ctrl2 is configured to close or open the controllable switch pairs SW4-SW4' . . . SW6-SW6' in dependence of the control signal ctrl. As discussed in the context of FIG. 1, the second controller may calculate a required value R and select an amplification factor B, and in line with the selected amplification factor B a corresponding number of controllable switch pairs SW4-SW4' . . . SW6-SW6' is closed.

The output current circuit 206 receives the difference current $I_{diff}$ and provides the output current $I_{out}$. It may be advantageous if the output current $I_{out}$ has, except variations which depend on the temperature coefficient factor $TCF_{wanted}$ a substantially constant value which does not depend on the amplification factors A and B. Namely, if we assume that the first current I, and the second current $I_2$ are, except variations which depend on the temperature coefficient factor $TCF_{pos}$ and $TCF_{neg}$, substantially equal to each other, $I_{diff}$ has the value: $I_{diff}=A \cdot I_1-B \cdot I_1$ and, thus, the value depends on the amplification factor A and B. The output current circuit 106 is configured to divide the current $I_{diff}$ with a divisor C such that the value of $I_{out}$, except variations of the value of this current which depend on temperature differences and different value for the temperature coefficient factor $TCF_{wanted}$, is substantially constant, and, in an embodiment, is substantially equal to the first current $I_1$. The divisor C has to be equal to A-B.

The output current circuit 206 comprises a plurality of parallel arranged output mirror MOS transistors N5 . . . N7, an output MOS transistor N8 and a third controller CTRL3, 206. The plurality of output mirror MOS transistors N5 . . . N7 and the output MOS transistor N8 are of the same type as the second MOS transistor N1 and the plurality of second mirror MOS transistor N2 . . . N4. The plurality of output mirror MOS transistor N5 . . . N7 are arranged in a parallel configuration and may be coupled with a corresponding controllable switch SW7 . . . SW9 in the current conduction path of the difference current $I_{diff}$. The difference current $I_{diff}$ is subdivided over a number of output mirror MOS transistors N5 . . . N7 which are with the controllable switch SW7 . . . SW9 in the current conduction path of the difference current $I_{diff}$. Each one of the controllable switches SW7 . . . SW9 forms a pair with another controllable switch SW7' . . . SW9' which is arranged in an electrical coupling between a drain and a gate of its corresponding output mirror MOS transistor. The controllable switches SW7 . . . SW9-SW7' . . . SW9' are closed and opened pair-wise by the third controller. The gates of all output mirror MOS transistors N5 . . . N7 are coupled to a gate of the output MOS transistor N8, and thereby they form a current mirroring circuit. If, for example, only the controllable switches of the pair SW7-SW7' are closed, and the controllable switches of pairs SW8-SW8' and SW9-SW9' are opened, the current which flows through output mirror MOS transistor N5 is mirrored by output transistor N8 and, thus, $I_{out}=I_{diff}$. If, for example, the controllable switches of the pairs SW7-SW7', SW8-SW8' are closed, and the controllable switches of pair SW9-SW9' are opened, a current which flows through output mirror MOS transistors is equal to $I_{diff}/2$ and, consequently, the output current is $I_{out}=I_{diff}/2$ The output current $I_{out}$ can be made substantially equal to the first current $I_1$ provided by the first current source 202 (if one assumes that the first current $I_1$ is substantially equal to the second current $I_2$) if the number of MOS transistors which conduct a current $I_1$ towards the common terminal 212 is equal to the number of MOS transistors which conduct a current $I_2=I_1$ away from the common terminal. Thus, if the first programmable amplifying current mirror 104 closes A switch pairs, and the second programmable amplifying current mirror 208 close B switch pairs, the output current circuit has to close C=A-B switch pairs. It is to be noted that the output current circuit has to close at least one switch pair in order to be able to provide the output current $I_{out}$. Further, it is to be noted that A should always be larger than B. Thus, the third controller CTRL3, 306 receives a control signal crtl which comprises information an $TCF_{pos}$, $TCF_{neg}$ and $TCF_{wanted}$, and calculated, corresponding to the calculations performed by the first controller CTRL1, 302, the second controller CTRL2, 304, the values for A and B, and subsequently calculates C, and subsequently the third controller CTRL3, 306 closes a corresponding number of switch pairs SW7-SW7' . . . SW9-SW9'. The first, second and third controllers may be operably coupled to the control module 106 of FIG. 1 and receive a selection signal therefrom.

In an example, the temperature coefficient factor of the first current source is $TCF_{pos}=3500$ ppm/K and the temperature coefficient factor of the second current source is $TCF_{neg}=-1450$, a number of $TCF_{wanted}$ can be created with the circuitry of FIG. 3 (calculation is based on formula (5)), see the subsequent table:

TABLE 1 different possibilities for the amplification factors and a corresponding divisor factor

| A | B | C | $TCF_{wanted}$ of $I_{diff}$ |
|---|---|---|---|
| 2 | 1 | 1 | 8450 ppm/K |
| 3 | 1 | 2 | 5975 ppm/K |
| 3 | 2 | 1 | 13400 ppm/K |

It is to be noted that Table 1 is based on the assumption that B is larger than 0, because otherwise the ratio R=A/B would result in an infinite large value, however, the practical implementation of the temperature coefficient factor may include controllers which chose B to be 0.

The example of FIG. 3 is a relatively simple example which may be used to create, for example, three different temperature coefficient values, that is to say, to enable generation of a three-slope current output. The number of mirror MOS transistors coupled with a pair is controllable switches SWx-SWx' to a gate of a MOS transistor in each one of the programmable amplifying current mirrors may be larger (and/or different from the number presented in FIG. 3), which immediately increases the number of possible temperature coefficient factors which may be created.

Figure 4:
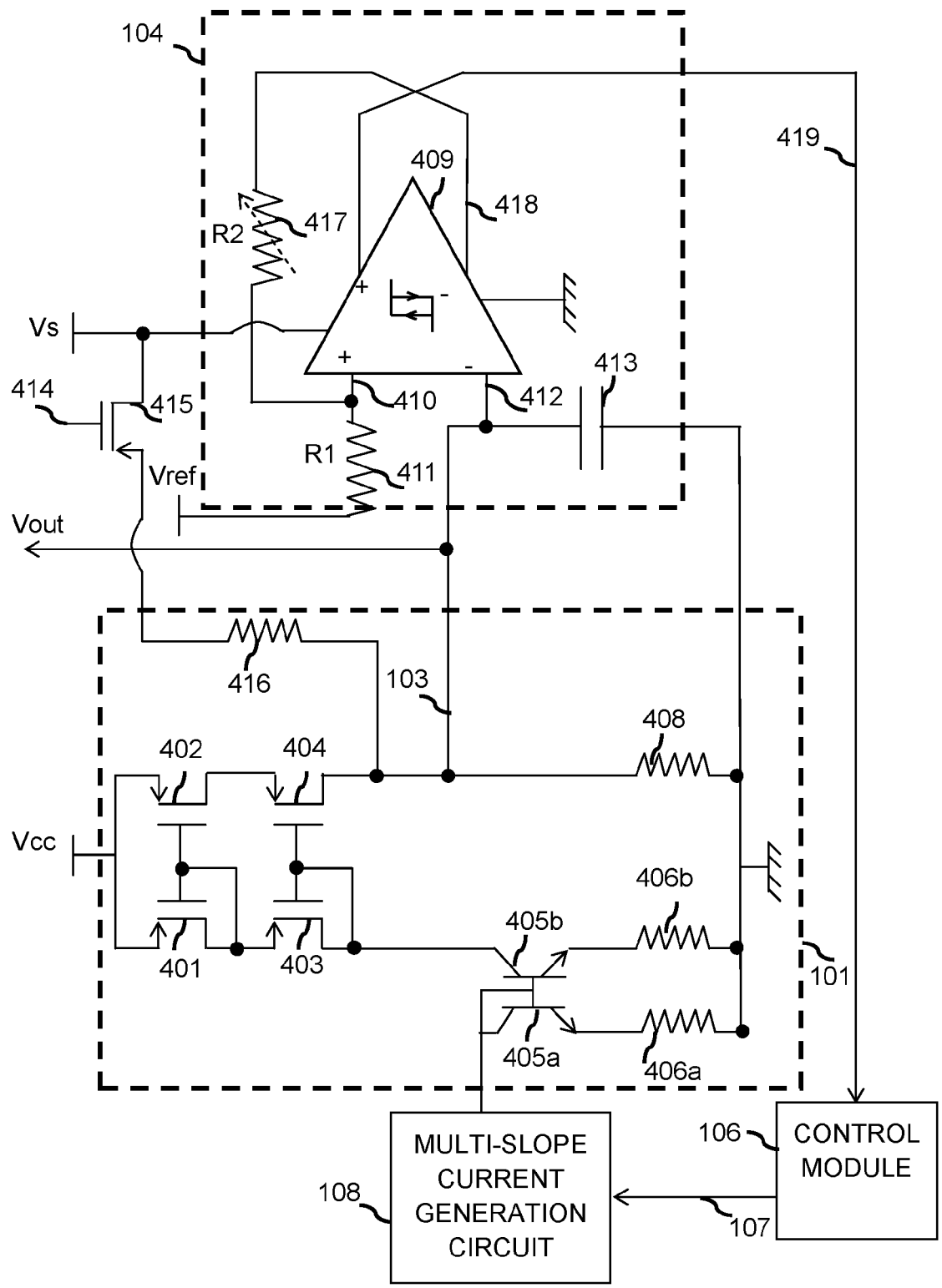
FIG. 4 is a simplified circuit diagram of a second example of apparatus for generating a temperature-dependent control signal.

Referring now to FIG. 4, a multi-slope current generation circuit 108 which may comprise a circuit of the type described with reference to FIG. 2 or FIG. 3 may be configured to generate two selectable temperature-dependent currents i1 and i2 where each of these currents may be a linear function of temperature, T. In this example, the first current may be represented as i1=S1T and the second current may be represented as i2=S2T where slopes S1 and S2 are different and pre-chosen in general, currents with positive and negative temperature coefficient factors (slopes) may be generated in the multi-slope current generation circuit 108 and combined in a predetermined manner in order to generate the two currents equalling S1T and S2T respectively. Whether the current I1 or i2 is generated at any one time may depend on receipt of a selection signal generated by the control module 106.

In the embodiment of FIG. 4 an example of the current-to-voltage converter 101 may comprise a cascode current mirror which may comprise four PMOSFETs (P-type Metal Oxide Silicon Field Effect Transistors) 401, 402, 403, 404, connected together in a conventional fashion. The cascode current mirror may be arranged to copy a temperature-dependent current which has been generated by the multi-slope current generation circuit 108. An interface arrangement comprising a first N type transistor 405a which may be operably coupled in series with a first resistor 406a and a second N-type transistor 405b which may be operably coupled in series with a second series resistor 406b may be included in the current-to-voltage converter 101 in order to interface the current received from the multi-slope current generation circuit 108 with the cascode current mirror. A supply voltage Vcc may be provided to the current-to-voltage converter 101 from an external source (not shown) and may have value of typically 5 Volts. In one embodiment, the PMOSFETs 401, 402, 403, 404 comprising the cascode current mirror may be sized in order to accurately mirror the received temperature-dependent current over a desired dynamic range. An output current of the cascode current mirror may be converted to a temperature-dependent output voltage Vout by a series resistor 408. The output voltage Vout from the current-to-voltage converter 101 may vary with temperature. Furthermore, the output voltage Vout may have a dual slope characteristic which mirrors the two currents i1 and i2. The output voltage Vout may, for example, be applied to a varactor in a VCO (not shown) in order to compensate for any temperature-dependence in the VCO's output frequency.

In the example of FIG. 4, a comparator 104 may comprise a hysteresis comparator 409 (or Schmitt trigger) implemented by a differential comparator with positive feedback. A non-inverting input 410 of the hysteresis comparator 409 may be operably coupled with a reference voltage Vref via a series resistor 411 having a value R1. The value of the reference voltage Vref may be pre-set and any appropriate, known voltage source (not shown) can be used to provide it. The reference voltage Vref can be thought of as a "break point" in a voltage-temperature characteristic. An inverting input 412 of the hysteresis comparator 409 may receive the temperature dependent output voltage Vout which appears at the output of the current-to-voltage converter 101. A capacitor 413 may be provided between ground and the inverting input 412 and in conjunction with the resistor 408 may, perform low-pass filtering or smoothing of the output voltage Vout. A negative supply terminal of the hysteresis comparator 409 may be grounded. A positive supply terminal of the hysteresis comparator 209 may be operably coupled with a voltage supply Vs (not shown). This voltage supply Vs may be provided by an appropriate, conventional power supply and may be separate, in some embodiments, from the voltage supply Vcc which supplies a voltage to the current-to-voltage converter 101. In one embodiment, the voltage supply Vs to the hysteresis comparator 409 may be selectively disabled and enabled depending on a signal, generated externally, on line 414 and applied to the gate of a PMOSFET 415 whose drain may be connected to the voltage supply Vs and whose source may be operably coupled to the output of the current mirror output of the current-to-voltage converter 101 via a resistor 416. The PMOSFET 415 may be used to preset a voltage at the junction of the resistors 416 and 408. This helps the PMOS transistor 404 to operate in a safe operating area thereby preventing breakdown of the PMOS transistor 404 if Vout should be set to 0 volts in a disable mode of operation, for example. Under normal operating circumstances, the PMOSFET 415 is turned off.

A feedback resistor 417 having a value of R2 may be operably coupled between an inverting output 418 of the comparator 409 and the non-inverting input 410. In this way, the hysteresis comparator 209 may trigger, that is, change state and thereby generate a switching signal on its second output line 419 when the value of the voltage on the inverting input 412 (that is the output from the current-to-voltage converter 101) approaches the value of the reference voltage Vref with a hysteresis value set at +/−Vs·R1/(R1+R2). The use of a hysteresis comparator is advantageous because in cases where Vout is close to Vref, owing to comparator offset and Vref variation over temperature, instability could occur causing oscillations of Vout. To avoid this, a hysteresis value may be set around Vref.

The control module 106 may be arranged to be responsive to a change in state of the hysteresis comparators output. In one embodiment, when the control module 106 detects a change of state in the output of the hysteresis comparator 409, it may be arranged to generate a selection signal for application to the multi-slope current generation circuit 108. This selection signal may cause the multi-slope current generation circuit 108 to switch between generation of currents i1 and i2.

Figure 5:
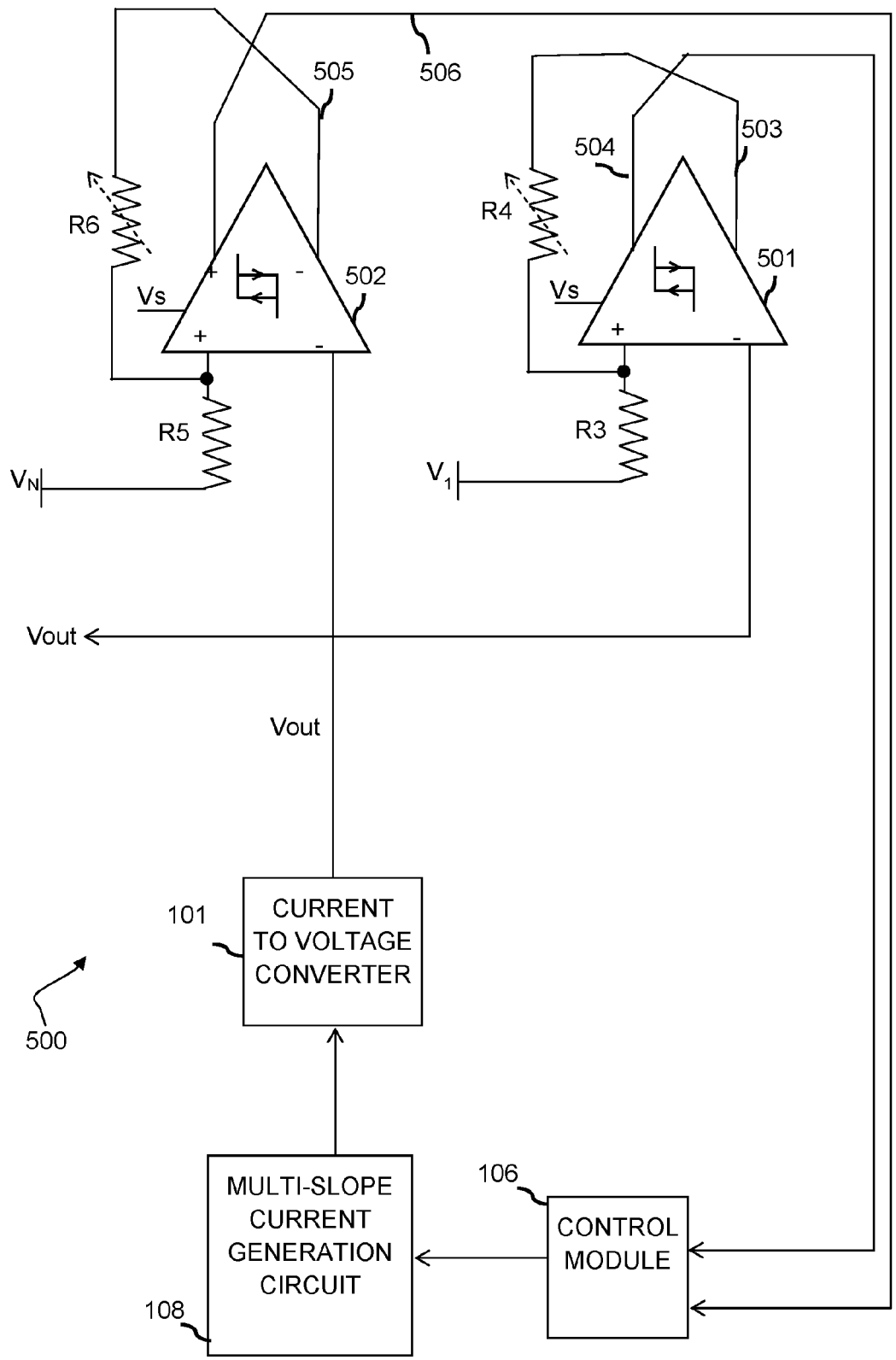
FIG. 5 is a simplified circuit diagram of a third example of apparatus for generating a temperature-dependent control signal.

An apparatus 500 for generating a temperature-dependent voltage control signal which has two or more break points will now be described with reference to FIG. 5. Referring now to FIG. 5, a multi-slope current generation circuit 108 which may comprise a circuit of the type described with reference to FIG. 2 or FIG. 3 may be configured to generate multi-slope selectable temperature-dependent currents. Each generated current may have a different and selectable temperature coefficient factor and may be output for conversion to a temperature-dependent voltage by a current-to-voltage converter 101. The current-to-voltage converter 101 may operate as described with reference to FIG. 4.

The output Vout of the current-to-voltage converter 101 may be connected to an inverting input of each of "N comparators. In one embodiment, each comparator may be a hysteresis comparator arranged to operate in a similar manner as described with reference to FIG. 4. Just two comparators 501, 502 are shown in FIG. 5 for the sake of clarity. A negative supply terminal of each comparator 501, 502 may be grounded. A positive supply terminal of each comparator 501, 502 may be operably coupled with a voltage supply Vs. This voltage supply Vs may be provided by an appropriate, conventional power supply (not shown).

In some embodiments, the voltage supply Vs may be controlled in the same fashion as described with reference to FIG. 4. A non-inverting input of the first comparator 501 may be operably coupled with a first reference voltage V1 via a series resistor having a value R3. The value of this first reference voltage V1 may be pre-set and supplied by an external voltage source (not shown). The value of this first reference voltage may comprise a first break point in a voltage-temperature characteristic of the apparatus 500. A non-inverting input of a second (or "Nth") comparator 502 may be operably coupled with a reference voltage VN via a series resistor having a value R5. The value of this second (or "Nth") reference voltage VN may be pre-set and supplied by an external voltage source (not shown). The value of this second reference voltage may comprise a second (or "Nth") break point in the voltage-temperature characteristic of the apparatus 500. In general, a voltage-temperature characteristic of "N" break points (equating to "N+1" slope current generation in the multi-slope current generation circuit 108), may require "N" comparators and therefore, "N" voltage references.

A feedback resistor having a value of R4 may be operably coupled between an inverting output 503 of the first comparator 501 and its non-inverting input. In this way, the first comparator 501 may trigger, that is, change state and thereby generate a switching signal on a second output line 504 when the value of the voltage on its inverting input (that is the output from the current-to-voltage converter 101) approaches the value of the reference voltage V1 with a hysteresis value set at $+/- Vs \cdot R3/(R3+R4)$. This second (non-inverting) output 504 of the first comparator 501 may be fed to a control module 106.

Similarly, a feedback resistor having a value of R6 may be operably coupled between an inverting output 505 of the Nth comparator 502 and its non-inverting input. In this way, the Nth comparator 502 may trigger, that is, change state and thereby generate a switching signal on its second output line 506 when the value of the voltage on its inverting input (that is the output from the current-to-voltage converter 101) approaches the value of the reference voltage VN with a hysteresis value set at set at $+/- Vs \cdot R5/(R5+R6)$. The second (non-inverting) output 506 of the second comparator 502 may be also fed to the control module 106.

The control module 106 may be arranged to be responsive to a change in state of any of the comparators' outputs and in response, to generate an appropriate selection signal for application to the multi-slope current generation circuit 108 In this way, the control module 106 may control current slope generation in the multi-slope current generation circuit. The control module may constantly monitor the output states of the comparators 501, 502. In one embodiment, the control module 106 may comprise a look up table functionality whereby states of comparator outputs are linked to an appropriate selection signal.

Consider an example where the multi-slope current generation circuit 108 is configured to provide a three-slope output (S1, S2, S3) and two comparators are provided and supplied with reference voltages V1 and V2 respectively where V2 is greater than V1. Say that initially, the outputs of each comparator are at a logical LOW. The output of the current-to-voltage converter 108 will also have three slopes S1, S2, S3. This output may be applied to a varactor of a VCO, for example which may be in close proximity to the apparatus 500 or even implemented within the same integrated circuit in some examples. Between voltage ranges 0 Volts and V1, the output Vout of the current-to-voltage converter 108 may have a first slope, S1. Between voltage ranges V1 and V2 the output Vout of the current-to-voltage converter 108 may have a second slope, S2. Above V2, the output Vout may have a third slope S3. As the operating temperature of the apparatus 100 rises, the voltage on the current-to-voltage converter's output will also rise. As Vout approaches V1 and reaches the trigger point of the first comparator 501, the output of the first comparator may go HIGH (and the output of the second comparator may remain LOW). That is to say that at some predefined temperature, the first comparator may trigger. The control module 106 may then detect these two states and consult the relevant entry in its look up table, which may result in a selection signal being applied to the multi-slope current generation circuit 108 which causes the latter to generate a current with a different slope, S2. Now Vout will have a different characteristic in accordance with a second slope S2. As Vout (and operating temperature) rises further, V2 will be approached and at some point, the second comparator 502 will trigger and its output state will change to a logical HIGH. The control module may detect that the second comparator's output has changed from LOW to HIGH but that the first comparator's output is still HIGH. Therefore it may generate a selection signal to cause the multi-slope current generation circuit to generate a current having a third slope. S3. So above a second pre-set temperature a voltage with a third voltage-current characteristic can be applied to a varactor of a VCO.

A similar procedure may occur as the temperature falls and the second comparator switches LOW (with the first comparator remaining HIGH) as V2 is approached. This time, the logic module may generate a selection signal to cause the multi-slope current generation circuit to switch from outputting a current with slope S3 to one with slope S2.

Figure 6:
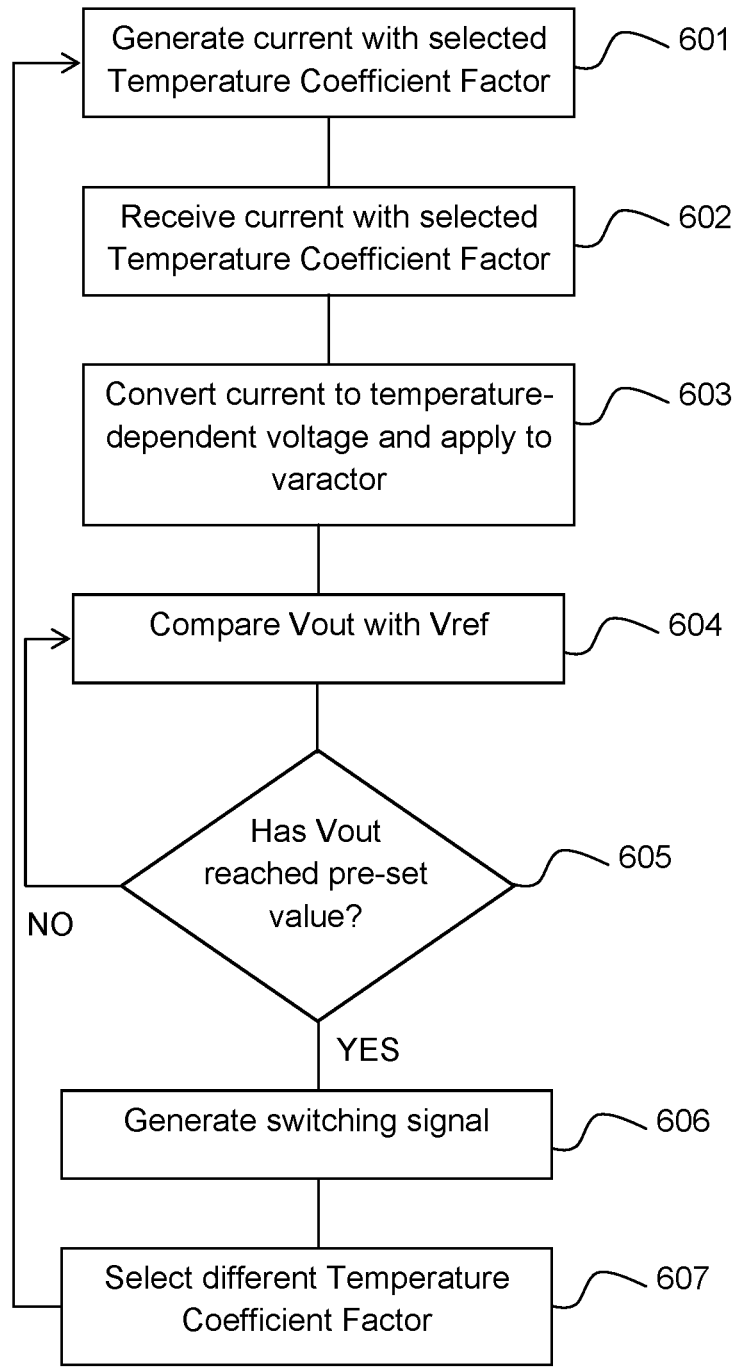
FIG. 6 is a simplified flowchart of an example of a method for generating a temperature dependent control signal.

An example of a method for temperature dependent control signal will now be described with reference to the flowchart of FIG. 6. In this example, a method 600 may generates a multi-slope temperature-dependent voltage signal suitable for application to a varactor of a VCO for the purpose of temperature compensation.

At 601, a temperature-dependent current which varies with temperature according to a selected one of two or more temperature coefficient factors may be generated.

At 602 the generated temperature-dependent current having the selected temperature coefficient factor may be received by a current-to-voltage converter.

At 603 the received temperature-dependent current may be converted to a temperature-dependent voltage. This temperature-dependent voltage may be used as a temperature-dependent control signal for application to a varactor in a voltage-controlled oscillator (VCO).

At 604, the converted temperature-dependent voltage may be compared with a reference voltage which may comprise a break point in a voltage-temperature characteristic and which may be equivalent to a pre-defined operating temperature.

At 605 when Vout reaches the reference voltage (or a value equal to a pre-set value relative to the reference voltage) a switching signal may be generated (at 606). Otherwise, the comparison of Vout with Vref continues.

At 607 in response to receipt of a switching signal, a selection signal may be generated. The selection signal may be used to select a different one of the two or more temperature coefficient factors for generation of a temperature dependent current, whereby the method may return to 601.

In the foregoing specification, the invention has been described with reference to specific examples of embodiments of the invention. It will, however, be evident that various modifications and changes may be made therein without departing from the broader spirit and scope of the invention as set forth in the appended claims.

While the invention has been described in the context of generating a temperature-dependent control signal for a VCO (and in particular for controlling a varactor in a VCO), it will be appreciated that the invention may have application to the control of other devices whose performance or characteristics may vary with operating temperature. For example, the invention may be used for providing a temperature compensation signal for use by a transducer.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. For example, the functionality of the modular blocks illustrated in FIG. 5 (specifically the functionality of the multi-slope current generator, current-to-voltage converter, comparators and control module may be embodied in a single module or a number of modules, such modules comprising any combination of these modular functions.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples of apparatus for generating a temperature-dependent control signal may be implemented as circuitry located on a single integrated circuit or within a same device. For example, the modules and circuitry described with reference to any of FIG. 1, 4 or 5 may be implemented in an integrated circuit That is to say that apparatus for generating a temperature-dependent control signal may be implemented in an integrated circuit. Such an integrated circuit may be a package containing one or more dies. Alternatively, the examples may be implemented as any number of separate integrated circuits or separate devices interconnected with each other in a suitable manner. Further, such an integrated circuit may also comprise a VCO having at least one varactor which may be controlled by the apparatus. For example, an integrated circuit device may comprise one or more dies in a single package with electronic components provided on the dies that form the modules and which are connectable to other components outside the package through suitable connections such as pins of the package and bondwires between the pins and the dies.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

The invention claimed is:

1. An apparatus for generating a temperature-dependent control signal, the apparatus comprising; a current-to-voltage converter arranged to receive a temperature-dependent current which varies with temperature according to a selected one of two or more temperature coefficient factors and to convert the received temperature-dependent current to a temperature-dependent voltage, a comparator arranged to receive the temperature-dependent voltage and to compare the received temperature-dependent voltage with a reference voltage and to generate a switching signal at an output of the comparator when the received temperature-dependent voltage reaches a pre-set value relative to said reference voltage, and a control module operably coupled to the output of the comparator and arranged to generate a selection signal for selecting a different one of said two or more temperature coefficient factors when a switching signal is received from the comparator, whereby a temperature-dependent control signal comprising a multi-slope temperature dependent voltage is generated at the output of the current-to-voltage converter.

2. The apparatus of claim 1 comprising a multi-slope current generation circuit arranged to generate a temperature-dependent current which varies with temperature according to a selected one of two or more temperature coefficient factors and having an output operably coupled to the current-to-voltage converter and an input operably coupled to the control module, and arranged to select a different one of said two or more temperature coefficient factors in response to a selection signal received from the control module.

3. The apparatus of claim 2 wherein the multi-slope current generation circuit comprises: a first current source for providing a first current varying with a temperature according to a positive temperature coefficient factor, a second current source for providing a second current varying with the temperature according to a negative temperature coefficient factor, a common terminal, a first programmable amplifying current mirror being coupled to the common terminal for conducting a first amplified current to the common terminal, a first input current being amplified by the first programmable amplifying current mirror according to a first amplification factor A, the first input current being one of the first current or the second current, the first programmable amplifying current mirror being configured to adapt the first amplification factor A in dependence of a control signal, a second programmable amplifying current mirror being coupled to the common terminal for conducting a second amplified current away from the common terminal, a second input current being amplified by the second programmable amplifying current mirror according to a second amplification factor B, the second input current being another one of the first current or the second current, the second programmable amplifying current mirror being configured to adapt the second amplification factor B in dependence of the control signal, a current output circuit being coupled to the common terminal, the current output circuit being configured for conducting a difference current away from the common terminal and for providing an output current varying with a temperature according to the a required temperature coefficient factor, the difference current being substantially equal to the first amplified current minus the second amplified current, the output current being based on the difference current.

4. The apparatus of claim 1 wherein the current-to-voltage converter comprises a cascode current mirror arrangement and an output resistor.

5. The apparatus of claim 1 wherein the comparator comprises N comparators each arranged to receive the temperature-dependent voltage and to compare the received temperature-dependent voltage with one of N different, respective reference voltages and to generate a switching signal when the received temperature-dependent voltage reaches a pre-set value relative to a respective reference voltage, and wherein the control module is operably coupled to the output of each comparator and arranged to generate a selection signal for selecting one of said two or more temperature coefficient factors, depending on a state of the outputs of each comparator.

6. The apparatus of claim 1 wherein the comparator comprises at least one hysteresis comparator.

7. The apparatus of claim 1 wherein the apparatus is implemented in an integrated circuit.

8. The apparatus of claim 1 wherein the apparatus is implemented with a voltage controlled oscillator in an integrated circuit.

9. A method for generating a temperature-dependent control signal, the method comprising; at a current-to-voltage converter, receiving a temperature-dependent current which varies with temperature according to a selected one of two or more temperature coefficient factors, converting the received temperature-dependent current to a temperature-dependent voltage, in a comparator, comparing the received temperature-dependent voltage with a reference voltage and generating a switching signal when the received temperature-dependent voltage reaches a pre-set value relative to said reference voltage, and in a control module, generating a selection signal for selecting a different one of said two or more temperature coefficient factors in response to receipt of a switching signal, whereby a temperature-dependent control signal comprising a multi-slope temperature dependent voltage is generated at the output of the current-to-voltage converter.

10. The method of claim 9 comprising generating a temperature-dependent current which varies with temperature according to a selected one of two or more temperature coefficient factors and in response to receiving the selection signal.

11. The method of claim 9 comprising applying the multi-slope temperature-dependent voltage to a varactor of a voltage controlled oscillator.

* * * * *